United States Patent [19]
Gopalsami et al.

[11] Patent Number: 5,153,516
[45] Date of Patent: Oct. 6, 1992

[54] SOLID-STATE NMR IMAGING SYSTEM

[75] Inventors: Nachappa Gopalsami, Naperville; Stephen L. Dieckman, Elmhurst; William A. Ellingson, Naperville, all of Ill.

[73] Assignee: The United States of America as represented by the United States Department of Energy, Washington, D.C.

[21] Appl. No.: 581,957

[22] Filed: Sep. 13, 1990

[51] Int. Cl.⁵ ............................................. G01R 33/20
[52] U.S. Cl. ................................................... 324/309
[58] Field of Search ................ 324/300, 307, 308, 312, 324/313, 314, 318, 322; 128/653 R, 653 A

[56] References Cited

U.S. PATENT DOCUMENTS 4,859,949 8/1989 McKenna .............................. 324/318
5,041,789 8/1991 Keller et al. ......................... 324/318

OTHER PUBLICATIONS

Listerud et al., "NMR Imaging of Materials", *Analytical Chemistry*, vol. 61, No. 1, p. 23a, Jan. 1, 1989.
"New Micro-Imaging Accessory for AM and MSL Systems", Bruker Instruments, Inc.

Primary Examiner—Michael J. Tokar
Attorney, Agent, or Firm—Helen S. Cordell; John M. Albrecht; William R. Moser

[57] ABSTRACT

An apparatus for use with a solid-state NMR spectrometer includes a special imaging probe with linear, high-field strength gradient fields and high-power broadband RF coils using a back projection method for data acquisition and image reconstruction, and a real-time pulse programmer adaptable for use by a conventional computer for complex high speed pulse sequences.

13 Claims, 9 Drawing Sheets

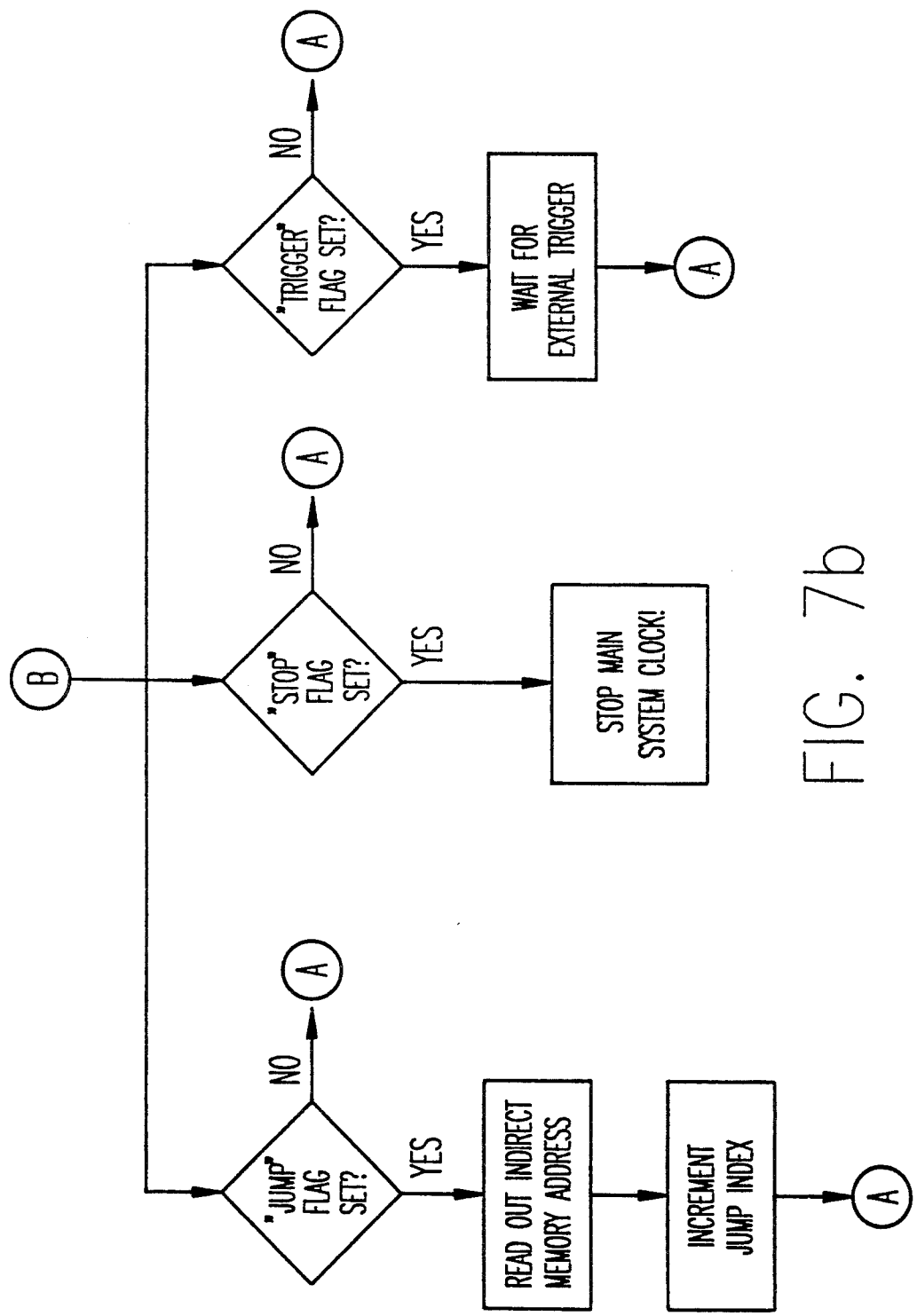

SOLID-STATE NMR IMAGING SYSTEM

CONTRACTUAL ORIGIN OF THE INVENTION

The U.S. Government has rights in this invention pursuant to Contract No. W-31-109-ENG-38 between the U.S. Department of Energy and the University of Chicago.

BACKGROUND OF THE INVENTION

Researchers have become increasingly aware of the potential for nuclear magnetic resonance (NMR) imaging, also called magnetic resonance imaging (MRI), for materials science applications. NMR uniquely allows noninvasive/nondestructive mapping of the internal chemical and physical properties of materials and provides quantitative information on the chemical microstructure of materials. (See further, "NMR Imaging of Materials, *Analytical Chemistry*, Vol. 61, No. 1, page 23a).

The current invention contemplates use of NMR imaging for any nuclei normally NMR imaged, including proton, carbon, sodium and phosphorus, in a variety of materials including polymers and geologic materials, such as coal, and is particularly useful in imaging structural ceramics.

Hydrogen nuclei (protons), which are present in organic binders of green ceramic bodies, are the most sensitive NMR-active nuclei that can be used for MRI studies. With proper set up of an imaging experiment (choosing pulse sequences), NMR signal intensity (gray scale levels) can be made proportional to the amount of organics present in a local volume of interest (voxels). Like x-ray computed tomography, MRI can be used to provide two dimensional tomographic images of selected slices and as a quantitative technique for determining spatial distribution of organics within a green body.

Medical MRI systems based on solutions NMR (e.g. using water molecules abundant in biological subjects) are inadequate for the imaging of organics within a green body primarily because of differences between the line widths of NMR spectra. For example, the line width of proton spectra from organics in green ceramic materials is about 2500 Hz, compared to a few Hz in biological systems. Because linear gradient fields are used in NMR imaging to frequency-label spatial positions, the gradient strength required to resolve two positions in space must be enough to ensure that the difference in resonance frequencies between these two positions is greater than the line widths of the resonances. The imaging of ceramics with a spatial resolution of 100 $\mu$m, for example, would require a gradient strength of 50 G/cm, which is beyond that normally found in medical systems.

Another difference is in imaging technique. While spin-warp imaging is used in medical MRI systems, back projection is the method of choice for materials with short spin-spin relaxation time, $T_2$ (large line widths correspond to short $T_2$). This method allows NMR response (FID) to be detected immediately after RF excitation, thus preserving maximum signal intensity. Back-projection, however, poses more stringent specifications on probe design, requiring (1) high uniform gradient and RF fields, (2) well-balanced gradient fields between orthogonal axes, and (3) strict alignment of static, gradient, and RF fields with respect to the center of the sample space. Also, the RF bandwidth must be great enough to span the entire range of frequencies produced by the gradient fields.

Modern NMR spectrometers and imaging units typically require some degree of digital control over a large number of subcomponents including RF amplifiers, RF receivers, frequency synthesizers, magnetic field gradient controllers, attenuators, filters and phase shifters. Demanding experimental sequences may require 100 nsec resolution, submicrosecond control, and output (perhaps thousands of commands over several seconds) to more than 250 digital control lines.

State of the art pulse programmers incorporate a pulse sequence to be expressed when the experiment is performed. The present invention provides an apparatus which provides for easy implementation with a variety of commonly available host computers and incorporates digital control ability to an expandable number of control/data acquisition lines, permitting on-site programming of complex, high speed pulse sequences with a large number of unique instructions for better resolution in pulse shaping.

It is therefore a primary object of this invention to provide a solid state NMR imaging system with high gradient field strength and the ability to narrow line widths.

In the accomplishment of the foregoing object, it is another important object of this invention to provide an NMR imaging system using back projection techniques while providing high uniform gradient and RF fields, well-balanced gradients fields between orthogonal axes, and strict alignment of static, gradient, and RF fields with respect to the center of the sample.

It is another important object of this invention to provide a flexible solid state NMR imaging accessory for operation with conventional wide-bore solid-state NMR spectrometers.

It is a further object of this invention to present an NMR imaging probe which permits use of alternative RF coils for varying sample sizes for increased efficiency and signal-to-noise ratio.

Finally, it is an object of the present invention to present a PC-based pulse programmer which is programmable to synchronize control pulses for gradient coils with a spectrometer radio frequency and which is usable with commonly available heat computers of choice.

SUMMARY OF THE INVENTION

To achieve the foregoing and other objects, this invention comprises an NMR imaging system, and more specifically, a flexible solid state imaging accessory for operation with conventional wide-bore solid-state NMR spectrometers. The imaging accessory includes a special imaging probe using the back projection method for data acquisition and image reconstruction, and a pulse programmer adaptable for use by conventional computers, useful for complex, high speed pulse sequences. In a current embodiment (designed for an 89 mm bore magnet) the imaging system uses samples up to 28 mm wide and can generate high linear gradient fields in excess of 50 G/cm at 10% duty cycle.

BRIEF DESCRIPTION OF THE DRAWINGS

The present invention is illustrated in the accompanying drawings where:

FIG. 7b is a logic diagram of run time flag decoding.

DETAILED DESCRIPTION OF THE INVENTION

Figure 1:
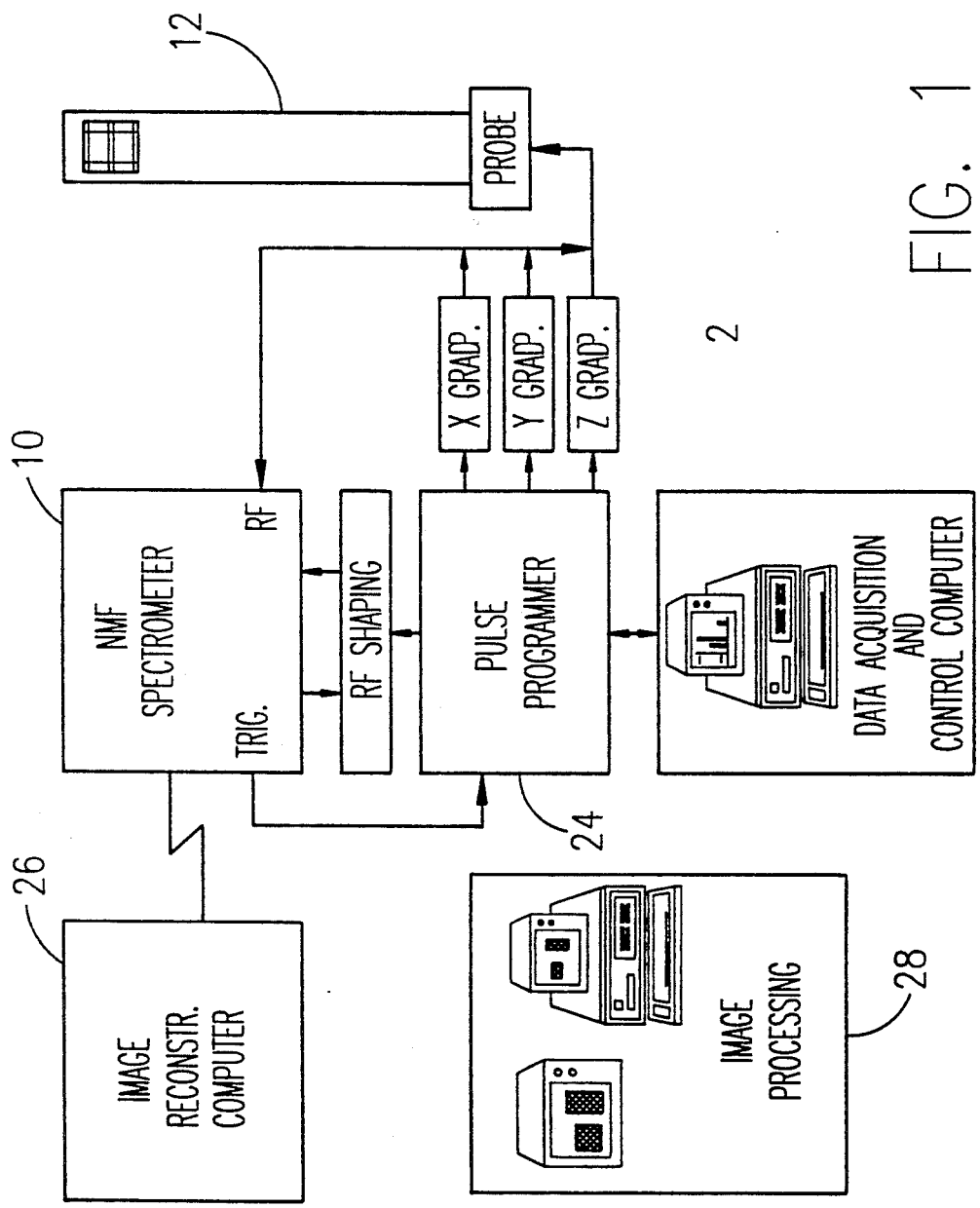
FIG. 1 is a block diagram of the solid-state NMR imaging system of the present invention.

FIG. 1 is a block diagram of the NMR imaging system of the present invention. The system is comprised of spectrometer 10, a special imaging probe 12, gradient amplifiers 22, a unique pc-based pulse programmer 24, image reconstruction computer 26, and PC-based graphics work station 28 for image processing and display.

Pulse programmer 24 consists of PC-based software and hardware which uses trigger pulses from spectrometer 10 to provide control pulses to x, y, z gradient amplifiers 22. Pulse programmer 24 (described in greater detail below) has flexibility to generate a variety of pulse protocols along with RF pulse shaping and is therefore adaptable to the spectrometer of choice. In the preferred embodiment, three Techron power amplifiers 22 (DC-45 kHz; 2 kVA) drive gradient coils in the constant-current mode based on gradient pulses from pulse programmer 24. NMR data are acquired on a Bruker Model CXP-100 spectrometer and then transported from an Aspect 3000 computer to a VAX 8700 computer via Ethernet for image reconstruction and processing.

Image reconstruction computer 26 for reconstruction of NMR back projection images uses software which includes features found in prior art software for NMR spectroscopy, tomographic reconstruction, and image display enhancement. NMR spectroscopic features include frequency and time domain filters, and FFTs for data conversion to frequency domain. Computed tomographic reconstruction of images occurs from spectroscopic data in the frequency domain. The reconstruction software implements filtered back projection algorithms with a choice of a wide variety of filters (convolution kernels).

Figure 2:
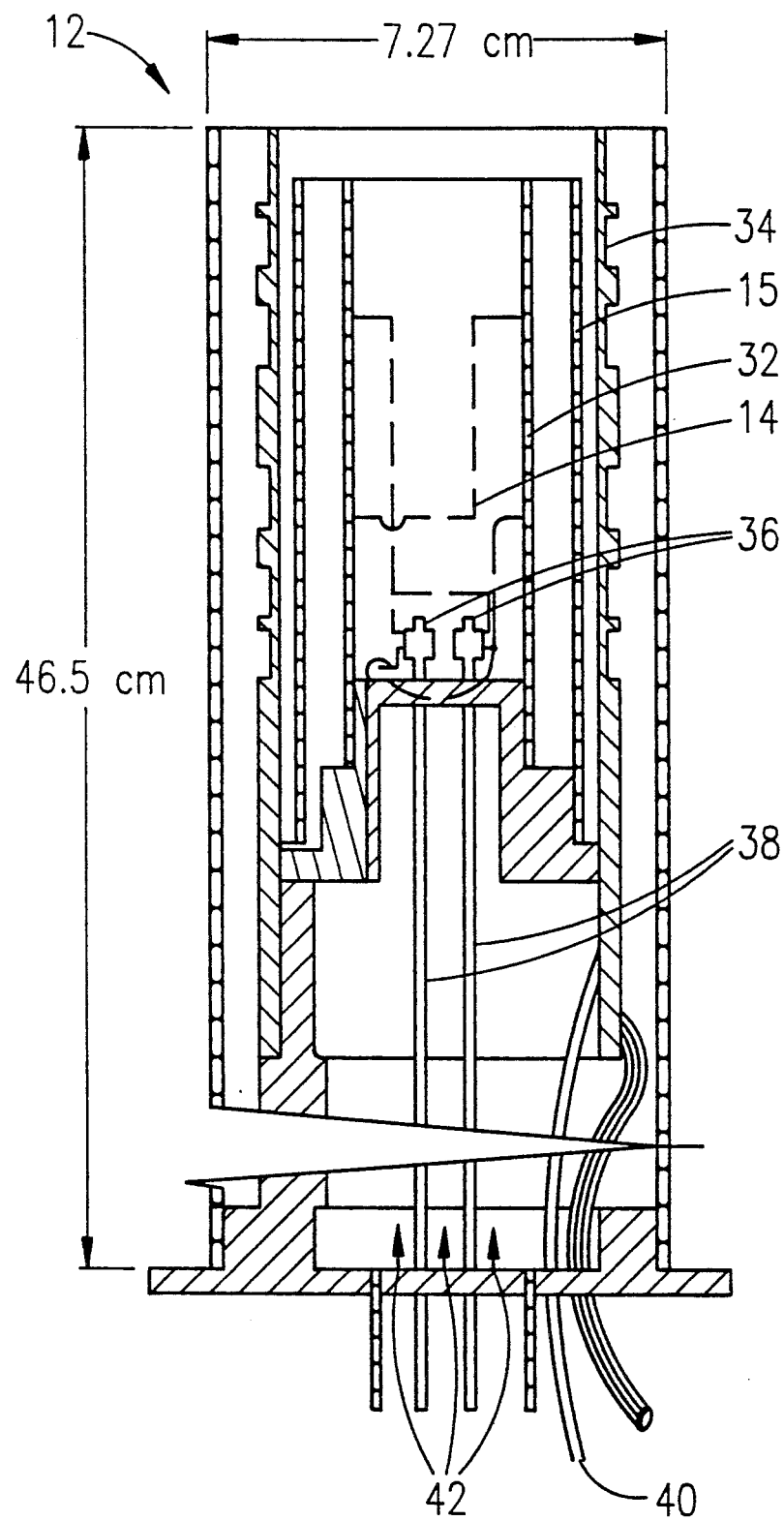
FIG. 2 is a schematic drawing of the imaging probe included in the imaging system.

FIG. 2 is a schematic drawing of imaging probe 12. In the preferred embodiment, probe 12 is designed to be used in an 89 mm vertical bore, 2.35-T superconducting magnet (not shown) and can accommodate samples up to 28 mm in diameter. Probe 12 includes: RF coil 14 wound on RF coil form 32, gradient coils 16, 18 and 20 (not shown) wound on gradient coil form 34, RF shield 15, tuning capacitors 36, tuning rods 38, and thermocouple 40.

To improve the filling factor of RF coil 14, probe 12 allows emplacement of different sized RF coils (<30 mm), depending on sample size. At high field strengths, gradient coils 16, 18 and 20 will generate considerable heat because of resistive losses; hence, thermal dissipation is enhanced using cooling air 42. As a safety feature, thermocouple 40 monitors the temperature, and signals a controller (not shown) to shut down the system when temperatures are excessive. Extraneous RF fields are, to a large extent, precluded from entering detection circuitry by RF shield 15, thus improving signal-to-noise ratio.

Figure 3A:
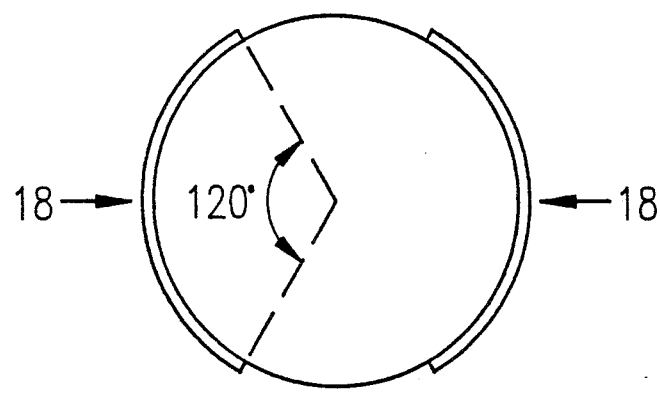
FIGS. 3a and 3b are schematic drawings of the probe's gradient coil geometry.
Figure 3B:
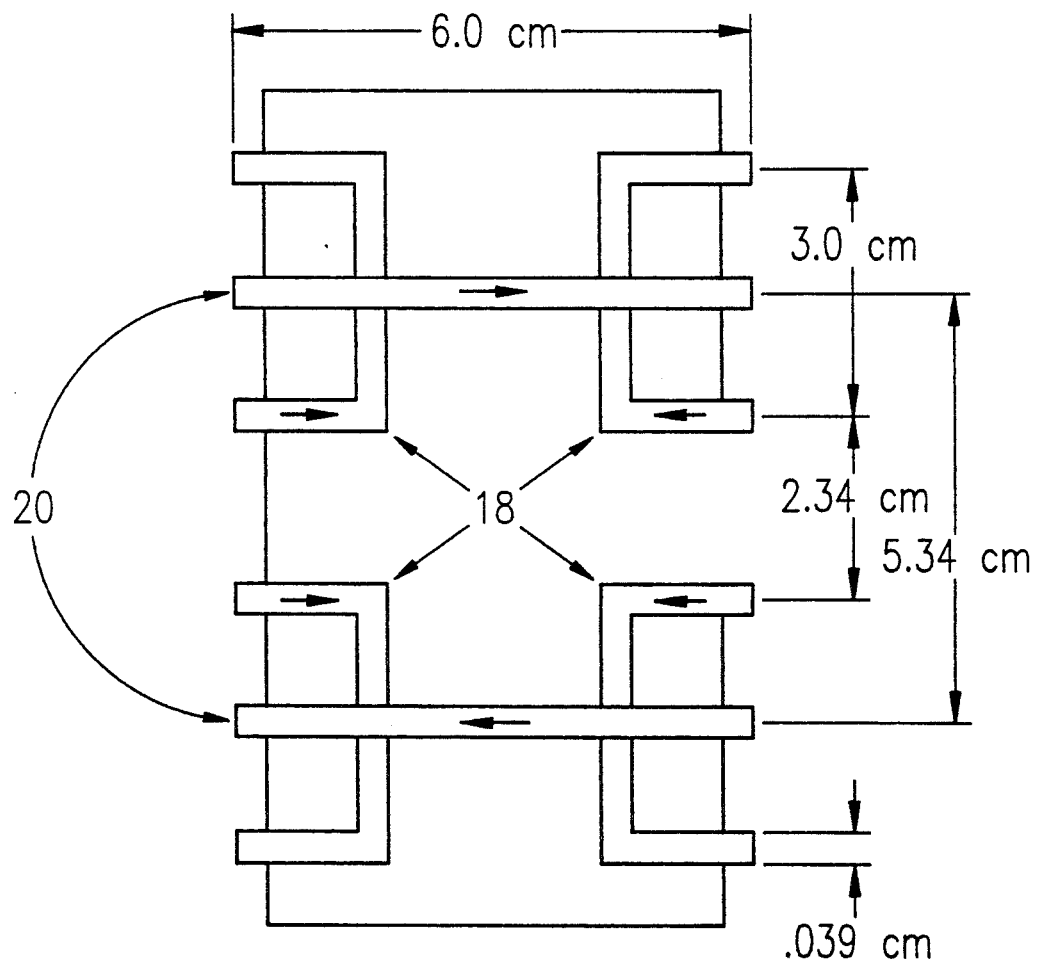

As depicted in schematic drawing FIG. 3a, y gradient coil 18 is designed in a saddle-type configuration, with a coil span of 120 degrees. The x gradient coil 16 (not shown) is identical but rotated by 90 degrees. As shown in FIG. 3b, a pair of Maxwell coils wound in opposite directions are used for z gradient 20.

Coils 16, 18 and 20 were designed for optimal field strength without loss of linearity and uniformity of field in a maximum sample space for the given bore using a finite-element analysis of fields with the computer code TOSCA TM from Vector Fields. In addition, winding and substrate materials were selected for high heat transfer characteristics and strength. For the given bore, high linearity and field strength are achieved using coils wound in two layers with 12 turns each of AWG 22 copper wire and the geometry depicted in FIG. 3b.

Figure 4B:
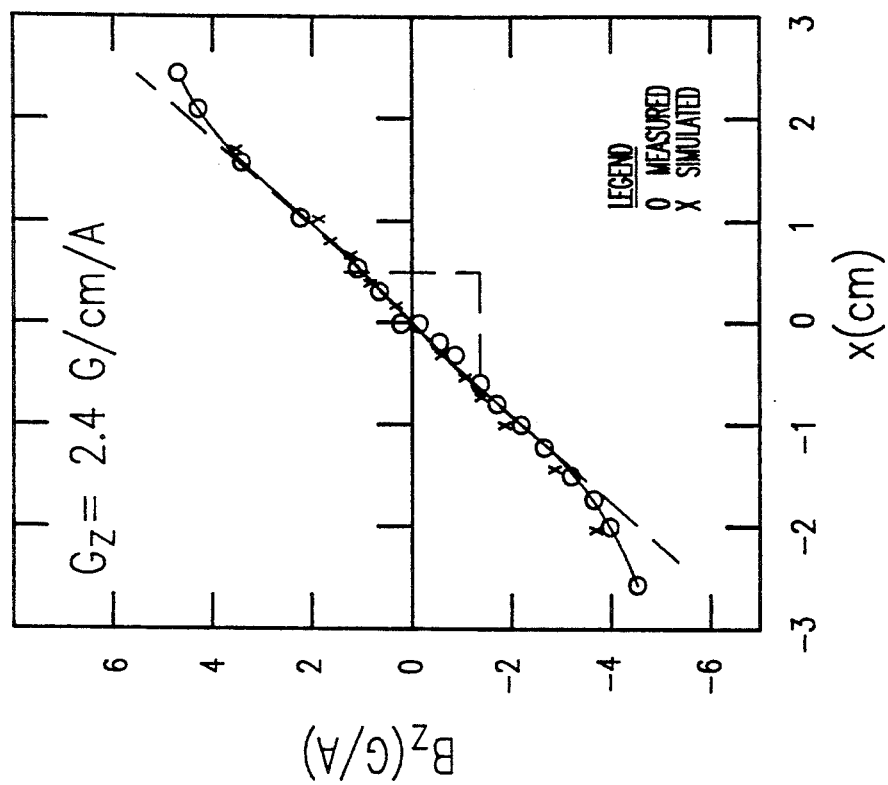
FIG. 4a and 4b are graphic plots of simulated and experimentally determined magnetic fields for the gradient coils.
Figure 4A:
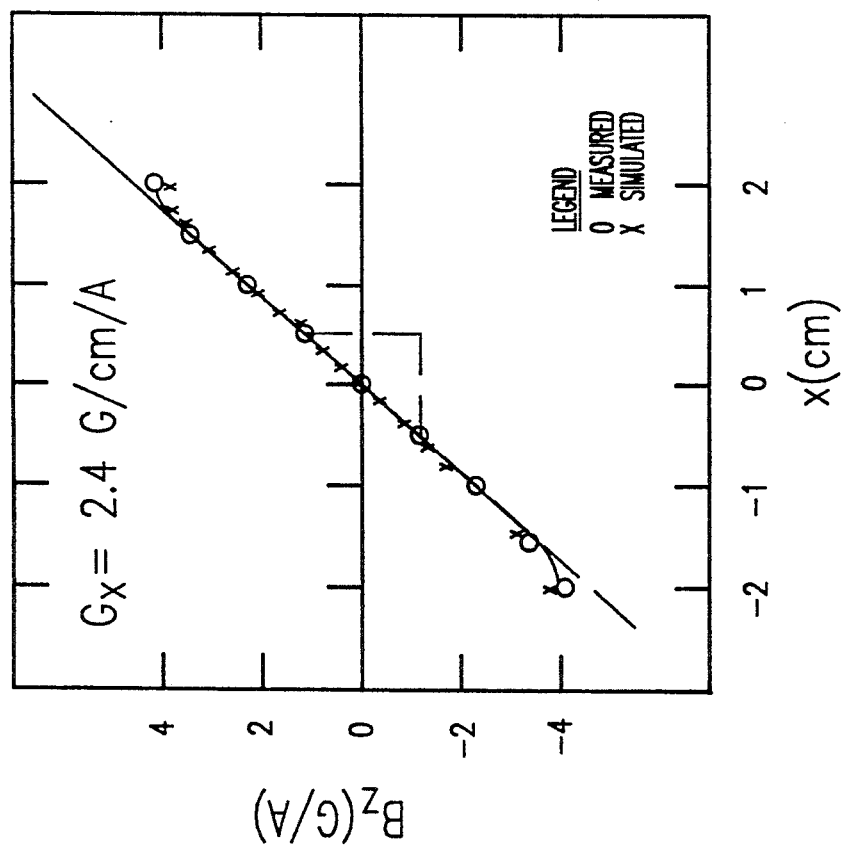

As depicted in FIGS. 4a and 4b, for all three gradients simulated fields show good agreement with measured fields. Testing was performed by driving with constant currents from a Techron power amplifier and measuring magnetic fields along x, y, and z axes with a Hall probe. Projected gradient strength of the fields is in excess of 50 G/cm at the maximum coil rating of 20 A at a 10% duty cycle.

Figure 5B:
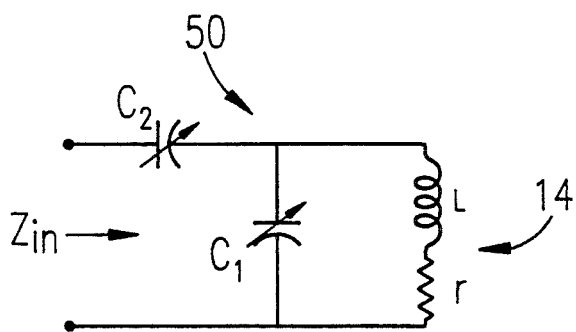
FIGS. 5a and 5b are schematic drawings of the RF coil geometry and of a tuning and matching circuit, respectively, and FIG. 5c a graphic plot of RF coil resonance.
Figure 5A:
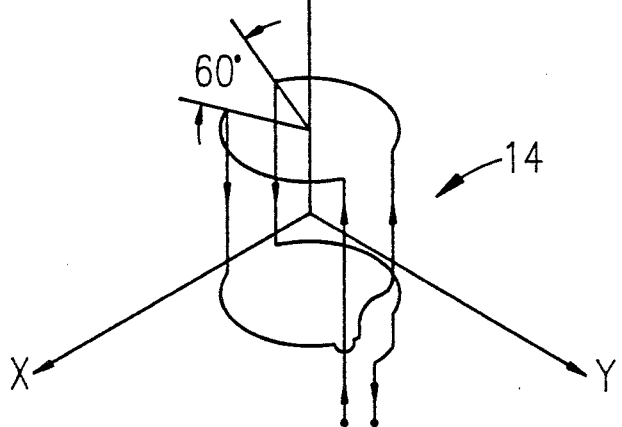

FIG. 5a is a schematic drawing of the geometry of RF coil 14. An RF coil must efficiently transmit RF power to the sample volume to excite nuclear spins and to detect precessing nuclear magnetization with a high signal-to-noise ratio. The main design requirements of the RF coil are that it should resonate at the desired operating frequency with a high Q, produce a homogeneous magnetic field transverse to the main magnetic axis, and provide a good filling factor. The saddle-type RF coil design shown in FIG. 5a satisfies these requirements in the frequency range of interest (100 MHz) and also allows convenient loading of samples. A single-turn coil was wound on a 30-mm outside diameter NMR glass tube, and its resonant characteristics were tested. As in the saddle coil design of the gradient coils, the span of the coil is 120 degrees; the height of the coil is nearly equal to the diameter of the coil form.

A tuning and matching circuit 50 shown in FIG. 5b was constructed so RF coil 14 can be resonated at an operating frequency of about 100 MHz and its impedance matched to 50 $\Omega$, which is the characteristic impedance of the coaxial cable which connects the coil to the transmitter and receiver circuits of the spectrometer.

Figure 5C:
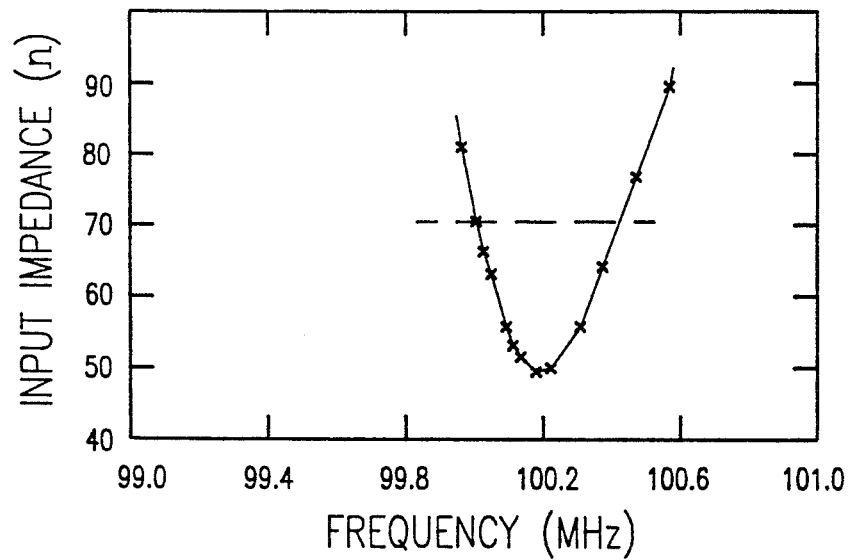

FIG. 5c shows the resonant behavior of the circuit with RF coil 14 operating at frequencies in the desired range; a quality factor (Q) of 239 was obtained with no sample inside the coil.

Figure 6A:
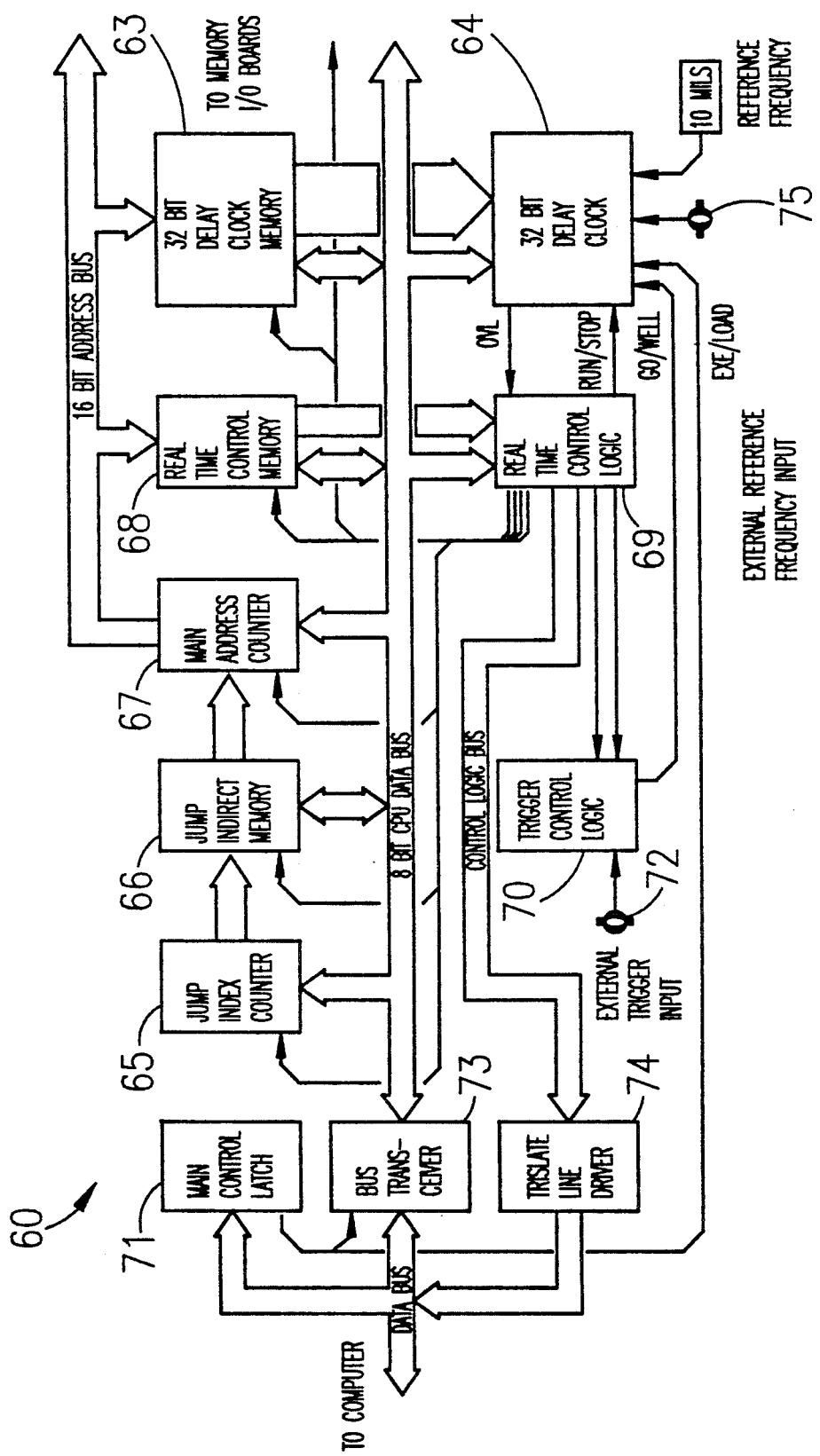
FIGS. 6a and 6b are block diagrams of the pulse programmer mother board (main controller board) and a memory I/O board, respectively.
Figure 6B:
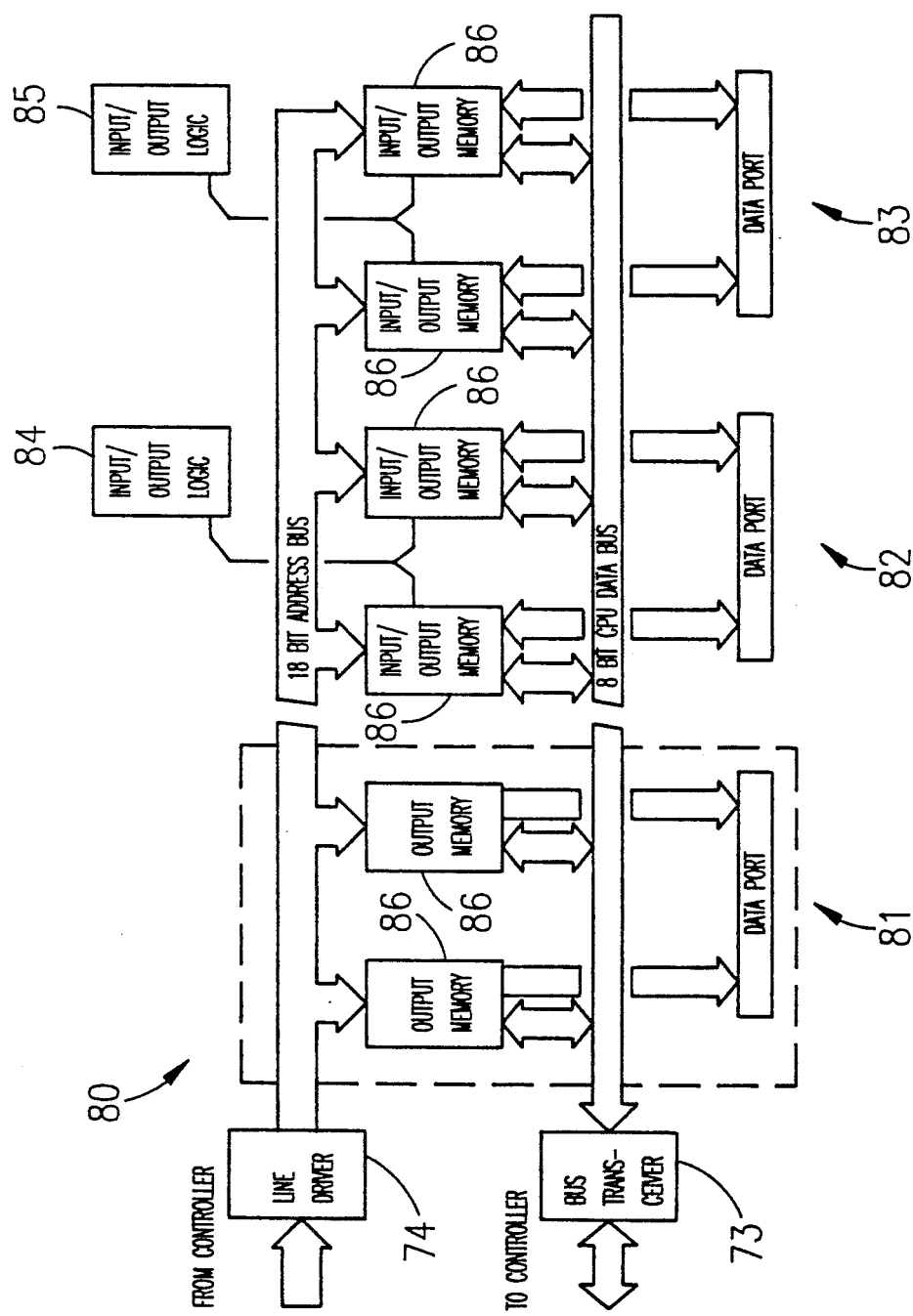

Designed as a set of circuit boards depicted in block diagrams FIGS. 6a and 6b, pulse programmer 24 includes the following general features:

(1) Random access jumping to any address, allowing implementation of complex pulse sequences, (2) On board data acquisition allowing jumper selectable data input on the memory I/O boards, (3) Expandability allowing a flexible configuration up to a maximum of 892 digital I/O control/data acquisition lines,
(4) Deep memory buffer (32 K deep memory) allowing implementation of complex pulse sequences that require a large number of unique instructions,
(5) High speed memory allowing 100 nsec access time, with a minimum state duration of 200 nsec, and
(6) General purpose CPU bus allowing easy implementation with a variety of commonly available host computers.

In FIG. 6a, pulse programmer mother board 60 provides real-time control of memory I/O boards shown in Fib. 6b and includes five main functions: delay counter implemented by delay clock memory 63 and delay clock 64; address generator implemented by jump index counter 65, jump indirect memory 66 and main address counter 67; control logic implemented by real time control memory 68, real time control logic 69, trigger control logic 70 and main control latch 71; external trigger input 72; and computer interface implemented by bus transceiver 73 and tristate line driver 74. System timing created by the 32 bit synchronous delay counter operates at 10 MHz, giving a resolution of 75 nsec, and a minimal pulse width of 200 nsec. In addition to the 10 MHz internal frequency standard, clock input 75 provides an external 10 MHz input to lock pulse programmer 24 to the frequency reference of spectrometer 10. The use of 32 K deep memory chips (easily increasable to 128 K) for both control functions and memory I/O boards allows the implementation of large complex pulse sequences. Trigger input 72 is both maskable and resettable, allowing multiple trigger requests within a pulse sequence.

Jumping is implemented through the technique of Indexed Indirect Addressing (IIA). This method of jumping incorporates an indexed memory lookup table which contains the new jump addresses. When the "Jump" instruction is encountered, the base address is loaded from the lookup table, followed by incrementing of the lookup table index. This method avoids loop nesting restrictions, and allows jumping to virtually any address. Thus, the IIA method is a true random access jumping method.

In FIG. 6b, memory board 80 consists of 128 bit wide 32 K deep user definable, synchronous digital I/O lines. Data I/O lines are grouped as eight 16 bit data ports with standard 40 pin header output. Data port 81 as depicted in FIG. 6b represents six of the eight bit data ports (five iterations of data port 81 are not shown). Two sixteen bit data ports 82 and 83 (thirty two of data lines) can be individually configured as either input or output ports as well as for external or synchronous internal triggering using input/output logic 84 and 85, respectively. This flexibility allows data acquisition without the additional hardware or the timing problems associated with direct computer controlled data acquisition. All memory chips 86 are static, low power, 100 nsec access time NMOS allowing data acquisition at the maximum controller rate of every two clock cycles or 200 nsec intervals. A maximum of seven memory boards can be daisy chained to the controller shown in FIG. 6a, allowing a total of 896 user definable I/O bits.

Operation of the NMR imaging system of the present invention is divided into two modes of operation : "Execute" and "Load". The active mode is determined by the host CPU and latched into the EXE/LOAD flag of the Main Control Latch.

In the LOAD mode the controller's main timer is disabled, and the internal data bus is activated. The host CPU then programs the system's latches, clocks and memory buffers with the appropriate bit patterns for the desired pulse sequence. Data transfers occur via the 8 bit data bus at the host's data bus rate.

Figure 7A:
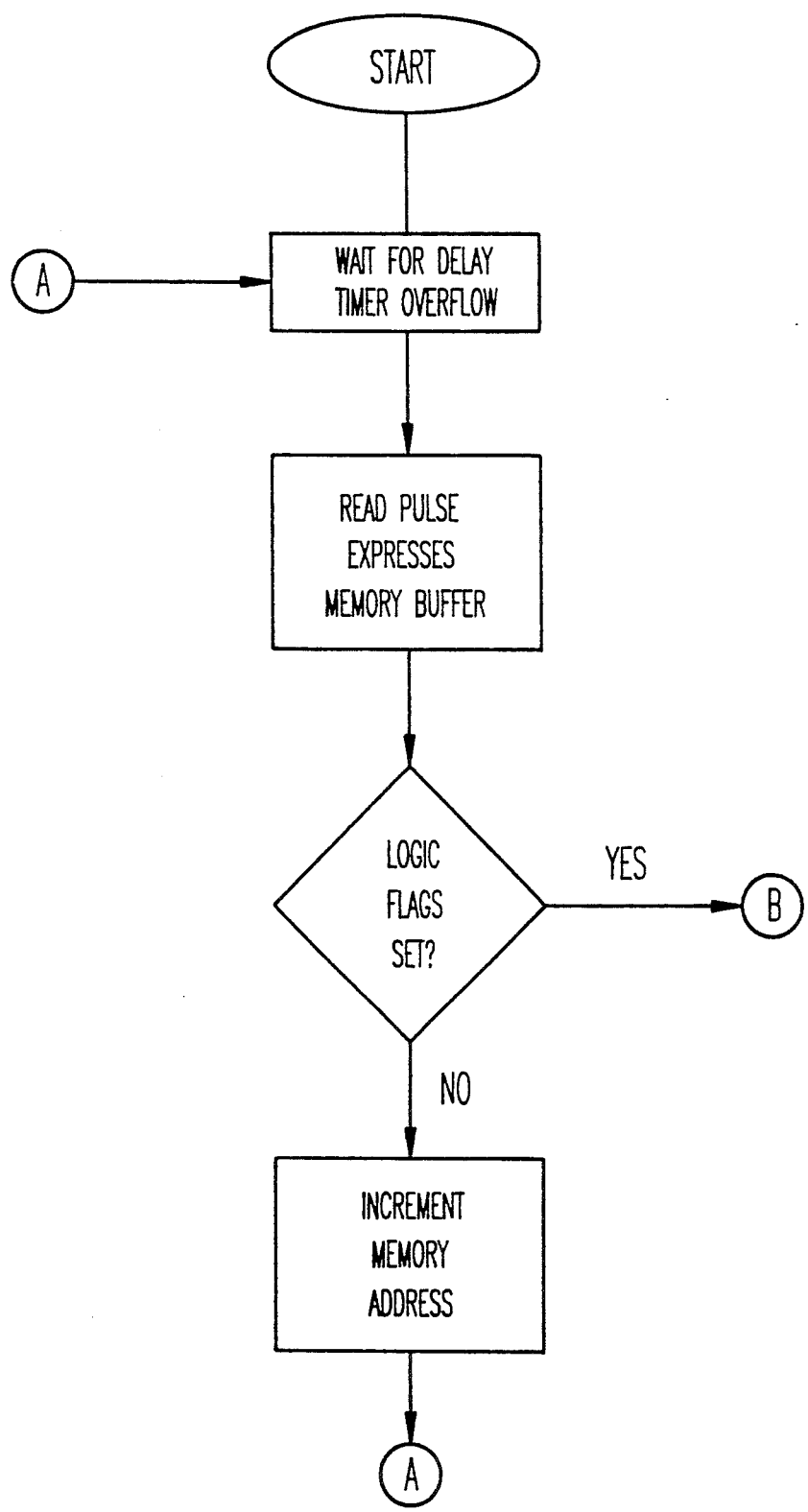
FIG. 7a is a logic diagram of the mother board operation during run time.

A flow diagram of the control sequence in "Execute" mode is shown in FIGS. 7a and 7b. When the NMR experiment begins, the host CPU sets the "EXE" flag in the main control latch, causing both the deactivation of the internal data bus, and the reactivation of the main system clock. The 32 bit system dwell clock increments until the overflow occurs at which time a read pulse is generated. The result is the synchronous expression of data from the 32 bit dwell clock memory buffer, the real-time control logic buffer, and the memory I/O boards. If the real-time logic control latch's "Jump" flags are not set, the memory address generator is sequentially incremented. With the "Trigger" and "Stop" flags unset, the experiment will continue with the output of data from the next memory address.

Testing and servicing the "Jump", "Stop", and "Trigger" flags occurs concurrently as indicated in FIG. 7b. When the "Jump" flag is encountered, a second read pulse is generated, causing the jump address to be read out of the jump indirect address memory, and latched into the memory address counter. The jump indexed counter is then incremented. If the "Trigger" flag is encountered, the main system clock is disabled, and reactivated when the external trigger occurs. The "Stop" flag completely stops the pulse programmer, by causing the main system clock to be permanently disabled.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical applications and should enable others skilled in the art to utilize the invention in various embodiments and with various modifications as are suited to the particular use contemplated. It is intended that the scope of the invention be defined by the claims appended hereto.

The embodiments of this invention in which an exclusive property or privilege is claimed are defined as follows:

1. An apparatus for use with a conventional solid-state NMR spectrometer, comprising:
an imaging probe which generates high linear gradient fields,
and a solid-state pulse programmer which when installed in a microcomputer is programmable and provides control pulse sequences for excitation of said imaging probe and for shaping of RF pulses and on board data acquisition and memory.

2. The apparatus of claim 1 wherein said imaging probe generates high linear gradient fields in excess of 50 G/cm at 10% duty cycle and permits emplacement of RF coils for samples which are 28 mm wide.

3. The apparatus of claim 2 wherein said imaging probe includes a saddle-type y gradient coil with coil span of 120 degrees, an identical x gradient coil rotated 90 degrees with respect to said y gradient coil, and a z gradient which includes a pair of Maxwell coils wound in opposite directions.

4. The apparatus of claim 3 wherein said imaging probe includes an RF coil designed in a saddle-type configuration with a span of 120 degrees and the height of said RF coil is approximately equal to the diameter of the coil form.

5. The apparatus of claim 1 wherein said solid-state pulse programmer allows random access jumping to any address and user definition of synchronous and asynchronous digital input/output configurations.

6. The apparatus of claim 5 wherein said solid-state pulse programmer permits data acquisition using both external and synchronous internal triggering.

7. The apparatus of claim 6 wherein said solid-state pulse programmer includes acquisition memory chips which are at least 32 K deep.

8. The apparatus of claim 7 wherein said solid-state pulse programmer includes ports for at least 12 B user definable, synchronous data input/output lines.

9. An NMR imaging system with solid-state components providing high gradient field strength and narrow line widths, comprising:

a magnet for generating a magnetic field, an imaging probe in said magnet, said imaging probe including amplifier-driven gradient coils generating high linear gradient fields in excess of 50 G/cm at 10% duty cycle, and an RF-powered coil for transmitting RF power to a sample enclosed in said imaging probe, spectrometer means for digitizing and processing NMR data generated from sample, a programmable solid-state pulse programmer installed in a microcomputer, said pulse programmer sequencing gradient pulses to amplifiers driving said gradient coils, shaping RF pulses transmitted to said sample, and acquiring and storing NMR data generated by said sample and said spectrometer, and imaging means for image reconstruction and processing of said NMR data.

10. The imaging system of claim 9 wherein said pulse programmer includes a mother board with solid-state implementations of delay counting, address generation, and internal and external triggering.

11. The imaging system of claim 10 wherein said mother board provides real-time control of multiple memory boards with user definable, synchronous and asynchronous digital input/output configurations.

12. The imaging system of claim 11 wherein said imaging probe uses the back projection method for data acquisition and image reconstruction.

13. The imaging system of claim 12 wherein said imaging probe includes a saddle-type y gradient coil with coil span of 120 degrees, an identical x gradient coil rotated 90 degrees with respect to said y gradient coil, and a z gradient which includes a pair of Maxwell coils wound in opposite directions.

* * * * *